United States Patent
Nikonov et al.

(10) Patent No.: US 9,559,698 B2
(45) Date of Patent: Jan. 31, 2017

(54) SPINTRONIC LOGIC ELEMENT

(71) Applicant: Intel Corporation, Santa Clara, CA (US)

(72) Inventors: Dmitri E. Nikonov, Beaverton, OR (US); Sasikanth Manipatruni, Hillsboro, OR (US); Michael Kishinevsky, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/906,025

(22) PCT Filed: Sep. 30, 2013

(86) PCT No.: PCT/US2013/062539
§ 371 (c)(1),
(2) Date: Jan. 19, 2016

(87) PCT Pub. No.: WO2015/047368
PCT Pub. Date: Apr. 2, 2015

(65) Prior Publication Data
US 2016/0173100 A1    Jun. 16, 2016

(51) Int. Cl.
*H03K 19/16* (2006.01)
*H01L 29/66* (2006.01)
(Continued)

(52) U.S. Cl.
CPC ............ *H03K 19/16* (2013.01); *G11C 11/161* (2013.01); *H01L 27/222* (2013.01);
(Continued)

(58) Field of Classification Search
CPC ........ H01L 43/08; H01L 27/222; H01L 27/22; H01L 29/66984; H01L 43/02; G11C 11/16; G11C 11/161; G11C 11/15; H01F 10/329; H01F 10/3254; H01F 10/3286; B82Y 25/00; B82Y 40/00; H03K 19/23; H03K 19/16; H03K 19/18; G01R 33/1284; Y10S 977/935
See application file for complete search history.

(56) References Cited

U.S. PATENT DOCUMENTS 6,654,944 B1    11/2003  Dike
8,063,460 B2 *  11/2011  Nikonov ............... B82Y 25/00
                                                257/421
(Continued)

FOREIGN PATENT DOCUMENTS

JP    2006191606    7/2006
TW    201244198     11/2012
(Continued)

OTHER PUBLICATIONS

Taiwan Intellectual Property Office, Office Action mailed Feb. 15, 2016 in Taiwan Patent Application No. 103133287. (Translation Redacted).

(Continued)

*Primary Examiner* — Vibol Tan
(74) *Attorney, Agent, or Firm* — Trop, Pruner & Hu, P.C.

(57) ABSTRACT

An embodiment includes a C-element logic gate implemented as a spin logic device that provides a compact and low-power implementation of asynchronous logic by implementing a C-element with spintronic technology. An embodiment includes a first nanopillar including a first contact and a first fixed magnetic layer; a second nanopillar including a second contact and a second fixed magnetic layer; and a third nanopillar including a third contact, a tunnel barrier, and a third fixed magnetic layer; wherein (a) the first, second, and third nanopillars are all formed over a free magnetic layer, and (b) the third fixed magnetic layer, (Continued)

the tunnel barrier, and the free magnetic layer form a magnetic tunnel junction (MTJ). Other embodiments are described herein.

25 Claims, 10 Drawing Sheets

(51) Int. Cl.
  *G11C 11/16* (2006.01)
  *H03K 19/18* (2006.01)
  *H01L 43/08* (2006.01)
  *H01L 27/22* (2006.01)
  *H01L 43/02* (2006.01)

(52) U.S. Cl.
  CPC ........ *H01L 29/66984* (2013.01); *H01L 43/02* (2013.01); *H01L 43/08* (2013.01); *H03K 19/18* (2013.01)

(56) References Cited

U.S. PATENT DOCUMENTS

| | | | |
|---|---|---|---|
| 8,198,692 B2 | 6/2012 | Nikonov | |
| 8,450,918 B2* | 5/2013 | Saito | F21K 9/00 250/458.1 |
| 8,604,886 B2* | 12/2013 | Nikonov | H01L 43/08 331/107 R |
| 8,933,522 B2 | 1/2015 | Manipatruni | |
| 9,203,013 B2* | 12/2015 | Li | G11C 11/16 |
| 9,231,194 B2* | 1/2016 | Kuo | H01L 43/10 |
| 2006/0145806 A1 | 7/2006 | Kim | |
| 2008/0238475 A1* | 10/2008 | Chua-Eoan | H03K 19/17736 326/38 |
| 2009/0194832 A1* | 8/2009 | Li | G11C 11/15 257/421 |
| 2009/0273972 A1 | 11/2009 | Han | |
| 2010/0315123 A1 | 12/2010 | Niemier | |
| 2010/0321993 A1* | 12/2010 | Nikonov | B82Y 25/00 365/171 |
| 2011/0147816 A1 | 6/2011 | Nikonov | |
| 2011/0148458 A1 | 6/2011 | Sugibayashi | |
| 2011/0297909 A1* | 12/2011 | Fukami | G11C 11/16 257/1 |
| 2012/0154063 A1 | 6/2012 | Nikonov | |
| 2012/0176154 A1 | 7/2012 | Behin-Aein | |
| 2012/0248556 A1 | 10/2012 | Nikonov | |

FOREIGN PATENT DOCUMENTS

| | | |
|---|---|---|
| WO | 2012/087551 | 6/2012 |
| WO | 2014/012624 | 1/2014 |
| WO | 2014/036510 | 3/2014 |
| WO | 2014/154497 | 10/2014 |

OTHER PUBLICATIONS

International Searching Authority, "Notification of Transmittal of the International Search Report and the Written Opinion of the International Searching Authority," mailed Jun. 26, 2014 in International application No. PCT/US2013/062539.

German Patent and Trade Mark Office "Office Action" mailed on Apr. 27, 2015 in application 10 2014 014 267.1.

* cited by examiner

200

| A | B | Cnew |
|---|---|------|
| 0 | 0 | 0 |
| 0 | 1 | C |
| 1 | 0 | C |
| 1 | 1 | 1 |

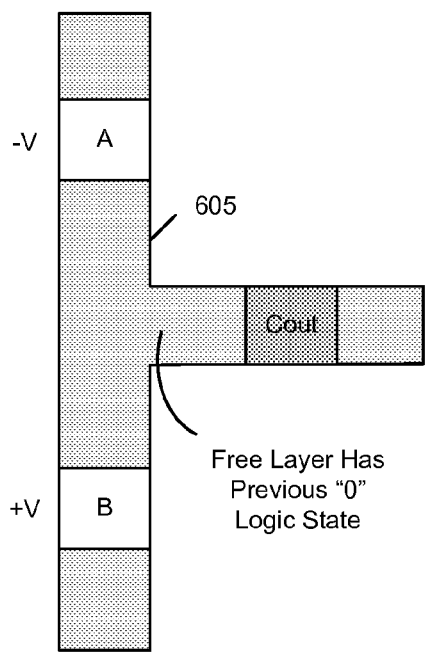
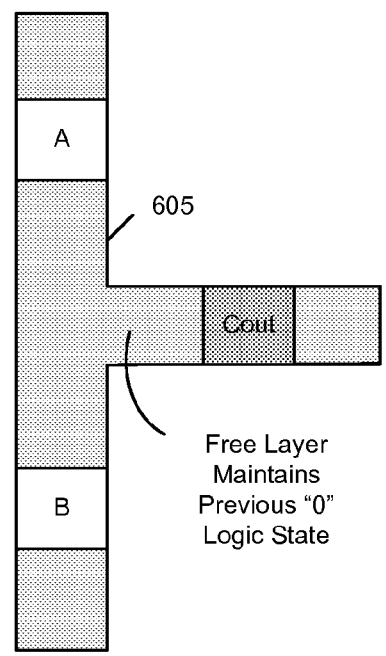
FIG. 6A          FIG. 6B
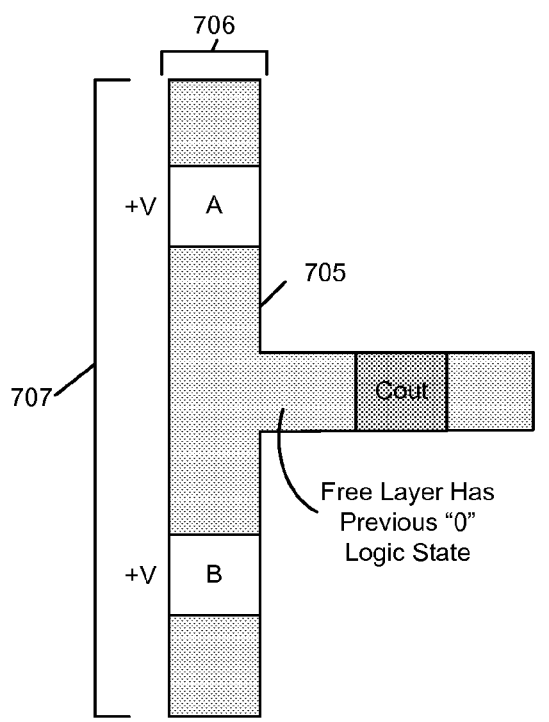
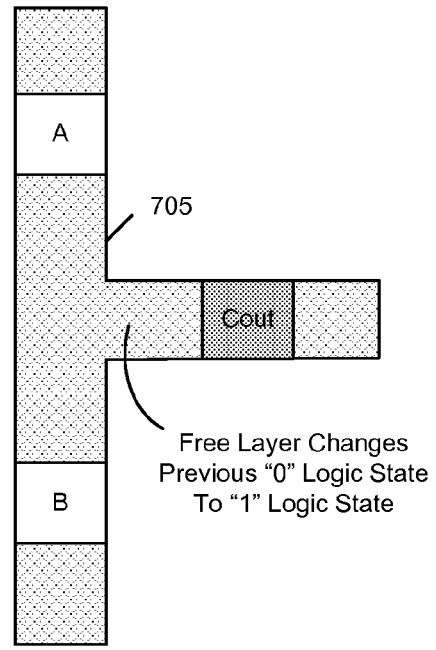
FIG. 7A          FIG. 7B

SPINTRONIC LOGIC ELEMENT

TECHNICAL FIELD

Embodiment of the invention are in the field of semiconductor devices and, In particular, spintronic logic.

BACKGROUND

Some magnetic memories, such as a spin transfer torque memory (STTM), utilize a magnetic tunnel junction (MTJ) for switching and detection of the memory's magnetic state. FIG. 1 describes spin transfer torque random access memory (STTRAM), a form of STTM. FIG. 1 includes a MTJ consisting of ferromagnetic (FM) layers 125, 127 and tunneling barrier 126 (e.g., magnesium oxide (MgO)). The MTJ couples bit line (BL) 105 to selection switch 120 (e.g., transistor), word line (WL) 110, and sense line (SL) 115. Memory 100 is "read" by assessing the change of resistance (e.g., tunneling magnetoresistance (TMR)) for different relative magnetizations of FM layers 125, 127.

More specifically, MTJ resistance is determined by the relative magnetization directions of layers 125, 127. When the magnetization directions between the two layers are anti-parallel, the MTJ is in a high resistance state. When the magnetization directions between the two layers are parallel, the MTJ is in a low resistance state. Layer 127 is the "reference layer" or "fixed layer" because its magnetization direction is fixed. Layer 125 is the "free layer" because its magnetization direction is changed by passing a driving current polarized by the reference layer (e.g., a positive voltage applied to layer 127 rotates the magnetization direction of layer 125 opposite to that of layer 127 and negative voltage applied to layer 127 rotates the magnetization direction of layer 125 to the same direction of layer 127).

BRIEF DESCRIPTION OF THE DRAWINGS

Features and advantages of embodiments of the present invention will become apparent from the appended claims, the following detailed description of one or more example embodiments, and the corresponding figures, in which:

FIGS. 5(a), 5(b), 6(a), 6(b), 6(c), 7(a), 7(b), and 7(c) illustrate how an embodiment of a spintronic C-element operates;

DETAILED DESCRIPTION

Figure 1:
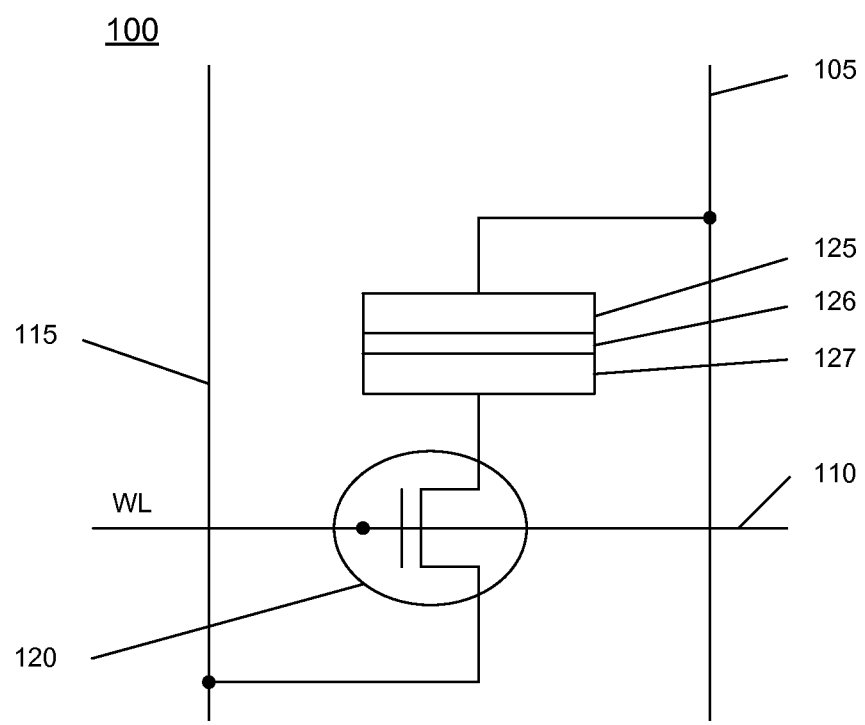
FIG. 1 depicts a conventional magnetic memory cell.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

STTRAM, described above, is just one example of "beyond CMOS" technology (or "non-CMOS based" technology), which relates to devices and processes not entirely implemented with complementary metal-oxide-semiconductor (CMOS) techniques. Beyond CMOS technology may rely on spin polarization (which concerns the degree to which the spin or intrinsic angular momentum of elementary particles is aligned with a given direction) and, more generally, spintronics (a branch of electronics concerning the intrinsic spin of an electron, its associated magnetic moment, and the electron's fundamental electronic charge). Spintronics devices may concern TMR, which uses quantum-mechanical tunneling of electrons through a thin insulator to separate ferromagnetic layers, and spin transfer torque (STT), where a current of spin polarized electrons may be used to control the magnetization direction of ferromagnetic electrodes.

Beyond CMOS devices include, for example, spintronic devices implemented in memory (e.g., 3 terminal STTRAM), spin logic devices (e.g., logic gates), tunneling field-effect transistors (TFETs), impact ionization MOS (IMOS) devices, nano-electro-mechanical switches (NEMS), negative common gate FETs, resonant tunneling diodes (RTD), single electron transistors (SET), spin FETs, nanomagnet logic (NML), domain wall logic, domain wall memory, and the like.

Figures 2A, 2B:
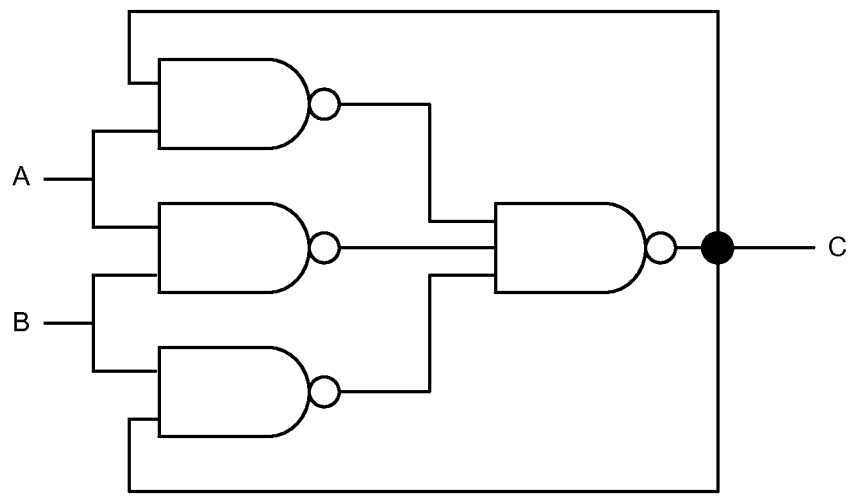
FIG. 2(a) addresses a conventional C-element and FIG. 2(b) addresses a corresponding truth table.

Regarding logic elements and as seen in FIG. 2(a), a Muller C-element logic gate is a critical logic device used in implementing asynchronous logic and has at least two inputs A and B and an output C (referred to as "C" or "Cout" herein). The C-element of FIG. 2(a) includes four NAND gates but many other variations of C-elements exist. As illustrated in truth table 200 of FIG. 2(b), the output C of the C-element circuit becomes high (logic "1") only upon all inputs A and B being high. The output also becomes low (logic "0") only upon all inputs A and B being low. A C-element may have more than two inputs, but is characterized by the behavior described in truth table 200. That is, only when all inputs are logic "0" will the output of a C-element be logic "0", and only when all inputs are logic "1" will the output be logic "1". For all other input combinations, the output of the C-element will hold its previous value (designated as "C" in table 200). C-elements may be used as a latch for asynchronous architectures and are a part of many other basic circuits.

C-elements may require many transistors (e.g., 16 transistors) depending on the specific implementation of the logic device. The need for many transistors results in a logic device that has a large die area. Area per gate may be specified in terms of the process generation parameter F. For example, a F=22 nm semiconductor process is currently available. Parameter F is determined by the resolution of available lithography methods and is approximately equal to the half-pitch of DRAM arrays. For example, with an average area per transistor of 75 $F^2$ a 16 transistor circuit has an area of 1,200 $F^2$. Furthermore, such a large circuit demands a large switching energy. Also, such a large circuit is volatile (i.e., the circuit requires a power supply and causes dissipation of standby power to maintain its logic device's state between state switching).

However, an embodiment provides a C-element logic gate implemented as a spin logic device. Due to the efficiencies and size of the spintronic logic device, the die real estate, switching energy, and volatility issues associated with conventional CMOS C-elements are lessened or resolved. In other words, an embodiment provides a more compact and low-power implementation of asynchronous logic by implementing a building block of such logic, the C-element, with spintronic technology.

An embodiment implements the logic functionality of a C-element with a spintronic device by encoding a logic state with magnetization of a FM film. Writing is performed using STT effect. Reading is performed by sensing the TMR of an MTJ. An embodiment implements the C-element on a FM wire having a width of 1 *F. The area of the C-element embodiment can be conservatively estimated as 32 $F^2$ (~40× smaller than CMOS implemented C-elements). A spintronic C-element is also non-volatile in that even when power to the device is switched off (e.g., for 1 hour, 1 day, 1 week, or 1 year), the circuit still maintains its logic state because the magnetization remains unchanged. This eliminates the need to expend standby power when the gate is not being switched.

Figure 3:
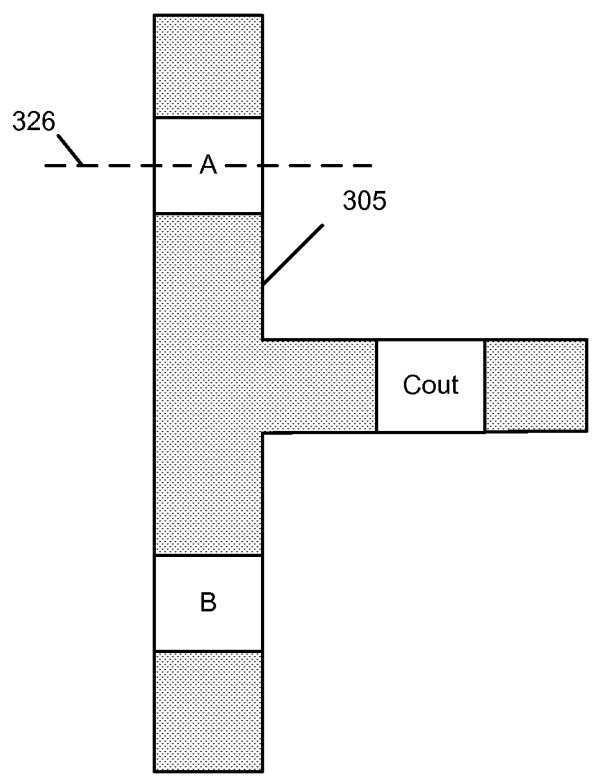
FIG. 3 depicts a top view of a spintronic C-element in an embodiment of the invention.

FIG. 3 includes a C-element in an embodiment of the invention. This includes a top view whereby contacts A, B, and Cout are shown atop 3 nanopillars. The 3 nanopillars all rest on a common magnetic free layer 305. A "common" free layer, as used herein, is "common" to all three nanopillars and is "shared" among them. In an embodiment the free layer is monolithic, whereas fixed layers within the nanopillars are not monolithic with one another. This arrangement electrically isolates nanopillars (above the free layer) from one another in order to direct currents entering the nanopillars from the tops of the nanopillars to the surface of the free layer. The present shape of the layout (FIG. 3) is shown as an example only. Other embodiments may allow for other configurations where, for example, a segment of the free layer connects nanopillars "A" and "Cout" and a segment of the free layer connects nanopillars "B" and "Cout" (but not necessarily in a "T" formation). For example, an embodiment may use a "stair step" or "jogged" pattern where the A nanopillar couples to the free layer on one side of the Cout nanopillar (at a 90 degree angle) and the B nanopillar couples to the free layer on another side of the Cout nanopillar (at a 90 degree angle). In another embodiment the A nanopillar couples to the free layer on one side of the Cout nanopillar and the B nanopillar couples to the free layer on another side of the Cout nanopillar wherein the A, B, and C nanopillars are arranged linearly. Thus, the "T" formation shown in FIG. 3 is not essential or required in all embodiments.

Figure 4:
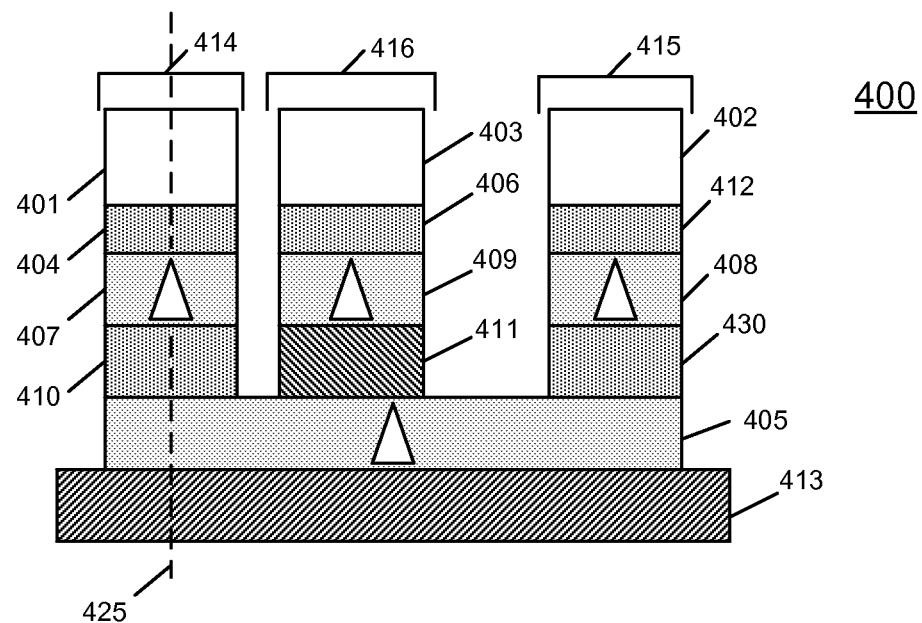
FIG. 4 depicts a corresponding side view of the C-element.

FIG. 4 provides a cross-section view for the C-element. Free ferromagnetic layer 405 is formed on an optional template layer (e.g., Ta and Ru) 413 or a substrate or some other layer formed on the substrate. A purpose of the template layer is to provide a surface with a crystal lattice structure that promotes deposition of the ferromagnetic layer with a uniform crystal structure and a uniform thickness. A magnetic junction or junctions may be formed from free FM layer 405, any or all of non-ferromagnetic layers 410, 411, and 430, and any or all of fixed FM layer 407, 409, 408. In one embodiment any of the non-ferromagnetic layers 410, 411, and 430 may be a tunneling barrier (e.g., $MgO$, $Al_2O_3$, $EuO$, and their alloys). In another embodiment (or in the immediately preceding embodiment) any of the non-ferromagnetic layers 410, 411, and 430 may be a non-ferromagnetic metal, such as Cu. In one embodiment layer 411 is a tunneling barrier formed under nanopillar 416 to increase the TMR ratio in the output current path. In another embodiment non-ferromagnetic metal layers 410 and 430 are formed under nanopillars 414 and 415 to decrease the resistance in the input current path.

In an embodiment nanopillar 416 further includes antiferromagnetic (AFM) layer 406 beneath contact 403. The role of the pinning AFM layer 406 is to prevent a fixed FM layer from undergoing rotation as a result of STT. Nanopillars 414 and 415 further include AFM layers 404 and 412 beneath contacts 401 and 402, respectively, for the same purpose as above. The AFM layer may comprise any material exerting surface exchange bias on a ferromagnet such as, for example, iron-manganese alloy or a platinum-manganese alloy. Nanopillar 415 includes a non-ferromagnetic layer 430 above free layer 405 and further includes fixed layer 408 beneath antiferromagnetic layer 412 and contact 402. Nanopillar 414 includes a non-ferromagnetic layer 410 above free layer 405 and further includes fixed layer 407 beneath antiferromagnetic layer 404 and contact 401. The white triangles depict the direction of magnetization at various locations in the C-element.

In an embodiment tunneling barrier 411 may include a 1 nm layer of MgO. Free FM layer 405 may include a 3 nm layer of Co, fixed FM layers 407, 408, 409 may include a 10 nm layer of Co, the pinning AFM layers may each include a 20 nm layer of PtMn, IrMn and/or their alloys, and electrodes 401, 402, 403 may include layers of Cu. In an embodiment nanopillar 414 includes the same or similar dimensions as nanopillars 415, 416. Nanopillar 414 may have a long axis 425, which measures about 130 nm from the bottom of layer 410 to the top of contact 401. Nanopillar 414 may include a short axis 326 (see FIG. 3 where nanopillar 414 is analogous to pillar A), which measures about 70 nm across the width of the nanopillar. However, other such embodiments are not so limited and may include heights of 90, 100, 110, 120, 140, 150 nm from the top of layer 405 to the tops of their respective contacts. Further each may include a width of 10, 20, 30, 40, 50, 60, 80, 90 nm or more. In one embodiment each nanopillar has a 20 nm×20 nm (horizontal cross-section) and be anywhere between 10-300 nm tall (vertically along axis 425). Transmission of electrons by way of current (supplied by virtue of a voltage applied across the material stack of nanopillar 414) drives electrons through the fixed FM layer 407 thereby applying a torque to free FM layer 405.

In one embodiment nanopillars 414 and 415 are inputs, nanopillar 416 is an output, and antiferromagnets 404, 406, and 412 are formed in the same material layer. In an embodiment, portions 410, 411, and 430 are formed from a non-magnetic metal (e.g., Cu 3 nm in thickness). In another embodiment portion 411 includes a tunneling oxide (e.g., MgO 1 nm in thickness) and portions 410 and 430 include Cu (e.g., 3 nm in thickness). This arrangement increases the TMR for a read signal (making reading more accurate). In an embodiment portions 410, 411, and 430 are all MgO that is 1 nm in thickness. This increases spin polarization for injection into portion 405 and improves spin torque. Thus, portions 410, 411, 430, in various embodiments, constitute a non-ferromagnetic layer whose individual portions (410, 411, 430) can be a tunneling barrier or a metal located under each of the nanopillars. In one embodiment there is a tunneling barrier under the output and metal under both inputs, but other embodiments are not so limited.

FIG. 4 shows how the general layers of a STTRAM, located elsewhere on a chip that also includes the C-element, may be used in a similar fashion (e.g., by forming MTJs that provide TMR) to form a C-element with little incremental cost (since the layers already exist for the STTRAM). Also, embodiments are not limited to C-elements and may also include majority gates that can perform AND and OR logical functions, adder gates, and the like.

Figures 5A, 5B:
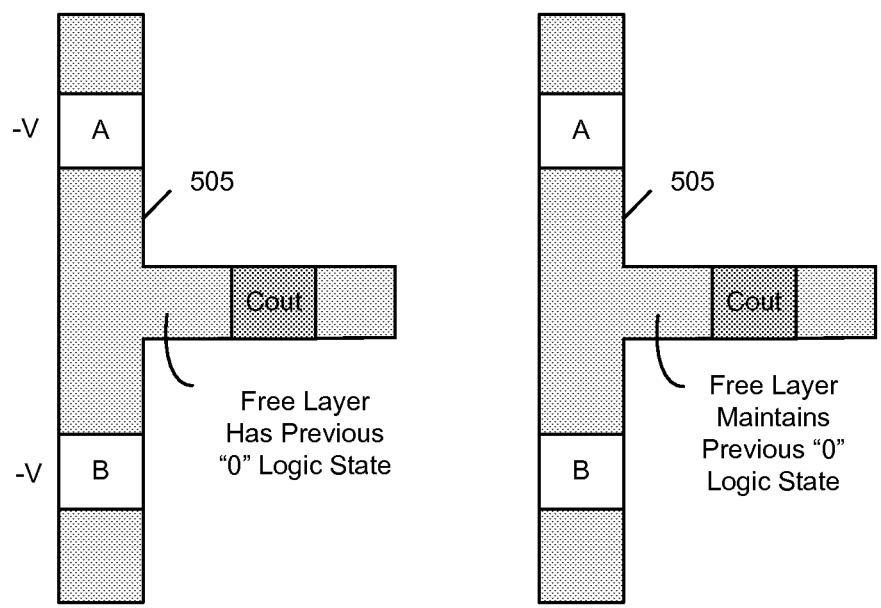

FIGS. 5(*a*), 5(*b*), 6(*a*), 6(*b*), 6(*c*) and 7(*a*), 7(*b*), 7(*c*) illustrate how an embodiment of a spintronic C-element operates.

In FIG. 5(*a*) the direction of current at inputs (A and B) determines the direction of the spin transfer torque applied to free layer 505 and promotes the direction of magnetization in FM free layer 505 under the nanopillars (e.g., 414, 415, 416 of FIG. 4). For example, a positive voltage (logical "1"), such as 0.5V, on A and B works to switch free layer 505 magnetization to a "down" direction and negative voltage, such as −0.5V, (logical "0") on A and B works to switch free layer 505 magnetization to an "up" direction. The currents associated with these voltages are applied as pulses (e.g., 100 μA for 2 ns) in an embodiment. The pulses need not be applied simultaneously to A and B, but may be applied simultaneously (e.g., some timing mismatch within the pulses to A and B is tolerable). Further, the choice of materials for magnetic layers (free and/or fixed) may lower the pulse period. For example, use of a Heusler alloy may lower the pulse duration to 30 ps.

FIG. 5(*a*) shows a particular instance where negative voltage is applied to both A and B. C has a previous state (i.e., a state that existed before the aforementioned negative voltage applications to A and B) that is a low logical state ("0"). FIG. 5(*b*) shows how after the pulse to A and/or B is switched off, the whole FM free layer 505 settles to a single direction of magnetization. It is read off by detecting the current through the output nanopillar (Cout). For example, if the magnetization is "up" there will be smaller resistance (TMR) and thus larger current to detect but if magnetization is "down" there will be larger resistance and thus smaller current to detect. FIG. 5(*b*) shows a particular instance where, based on negative voltage being applied to both A and B in FIG. 5(*a*), free layer 505 maintains its low logical state.

Figure 6C:
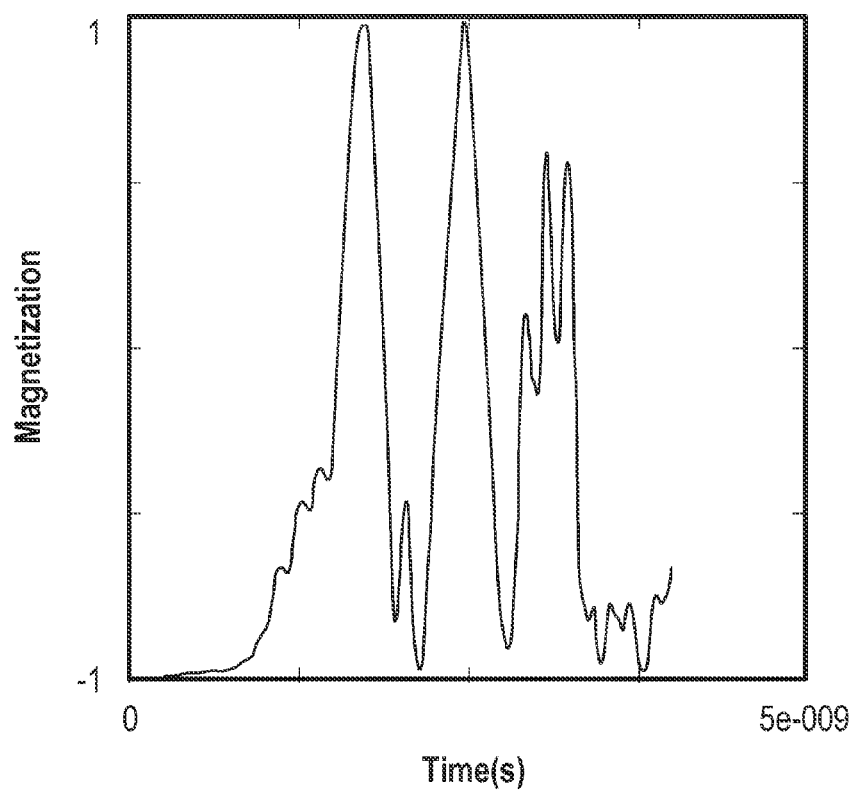

FIG. 6(*a*) shows a particular instance where negative voltage is applied to A and positive voltage is applied to B. C has a previous logic state (i.e., before the aforementioned voltage applications to A and B) that is low. FIG. 6(*b*) shows how after the pulse to A and/or B is switched off, the whole FM free layer 505 settles to a single direction of magnetization. In this instance, since the A and B inputs are of mixed voltage the previous Cout state (low) is maintained as free layer 605 maintains its low logical state. FIG. 6(*c*) shows the C-element temporarily transitioning from a "0" to a "1" state but then returning to a "0" state within 5 ns of the B input "going high." Specifically, FIG. 6(*c*) illustrates free layer 605 attempting to settle after inputs A and B are input. There is an intermediate unstable state as shown at the midway point along the X axis of FIG. 6(*c*). However, as shown at the right portion of FIG. 6(*c*) the free layer eventually settles and maintains its low state because only one of A and B is pulsed high.

Figure 7C:
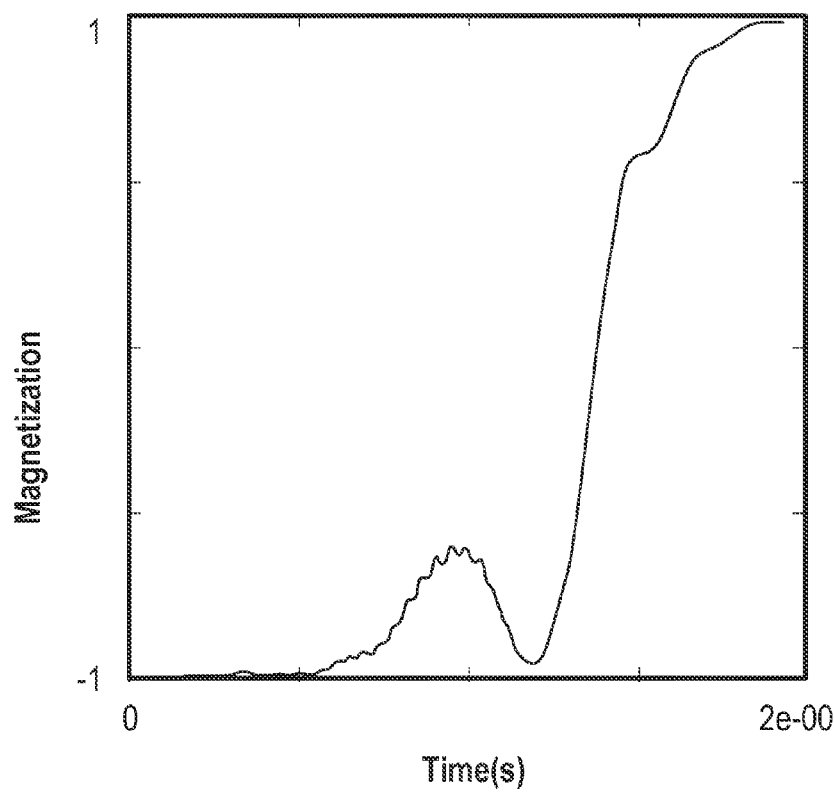

FIG. 7(*a*) shows a particular instance where positive voltage is applied to both A and B. C has a previous logic state (i.e., before the aforementioned voltage applications to A and B) that is low. FIG. 7(*b*) shows how after the pulse to A and/or B is switched off, the whole FM free layer 705 settles to a single direction of magnetization. In this instance, since the inputs are of positive voltage the previous Cout state (low) is changed to high as free layer 705 flips to a high logical state (note different hashing of free layer between FIGS. 7(*a*) and 7(*b*) indicating different logic states and magnetization directions such as "out of plane towards viewer" and "into plane away from viewer"). FIG. 7(*c*) shows the C-element transitioning from a "0" to a "1" state within 2 ns of the A and B inputs "going high." Thus, FIGS. 7(*a*), 7(*b*), and 7(*c*) illustrate a C-element changing its state. The C-element transient response depicted therein includes a ferromagnet with Ms (saturation magnetization or magnetic moment)=0.4 MA/m, wire width=20 nm (706), length=140 nm (707), thickness=2 nm, input current 100 μA to each of electrodes A and B, pulse time of 2 ns for the current, Gilbert damping=0.015, spin polarization=0.9, and out-of-plane uniaxial anisotropy=0.1 MJ/m$^3$.

In an embodiment, C-elements do not convert the logic state signal from the magnetic form to an electric form. Instead, the output magnetic wires of one C-element can serve as the input for another C-element or other logic gate (thereby avoiding the magnetic/electric conversion(s)). This transfers the change of magnetization from one element to another element. In another embodiment a spin polarized current passes from one element to the next and switches magnetization by STT. However, in other embodiments such conversions are performed using an embodiment of a transducer. For example, at a first C-element a signal is transformed from a magnetic signal to an electrical signal using a sense amplifier. Then at the next C-element, a CMOS driver supplies current to one of the nanopillars and converts back from an electrical signal to a magnetic signal.

Various embodiments use non-magnetic interconnects and magnetic repeaters to enable spin logic circuits. For example, an embodiment uses non-magnetic metal wire interconnects for spin current propagation with magnetic elements positioned at regular distances (or non-regular distances) along the wire to perform regeneration of spin signals. One embodiment includes an all spin interconnect system comprising nano-magnetic spin current repeaters communicating with one another (in a chain of repeaters) via nonmagnetic metallic interconnects. Some embodiments communicate a spin current signal without repeated conversion between spin and electrical signals (instead regenerating spin current using an interconnect system described below in conjunction with FIGS. 8(*a*) and 8(*b*)). This helps enable spin logic circuits by reducing power requirements (i.e., by avoiding conversion losses altogether or essentially altogether), reducing circuit size, and increasing circuit speed.

Figure 8A:
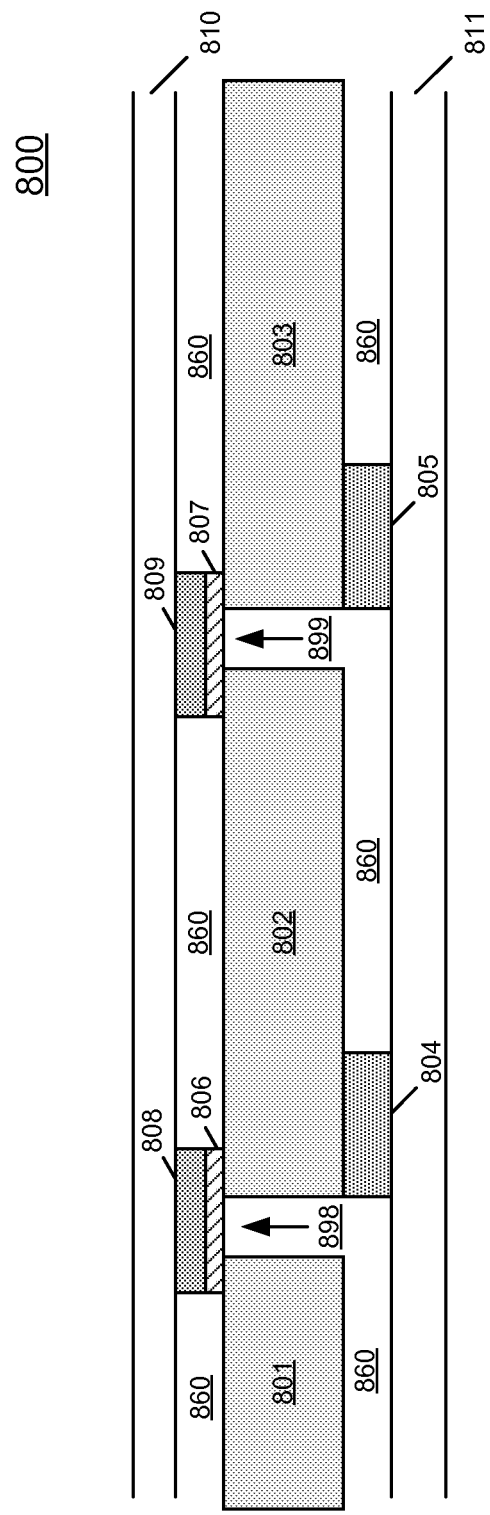
FIGS. 8(a) and 8(b) depict separate nanomagnets connected by non-magnetic wires in a spintronic C-element in an embodiment of the invention.
Figure 8B:
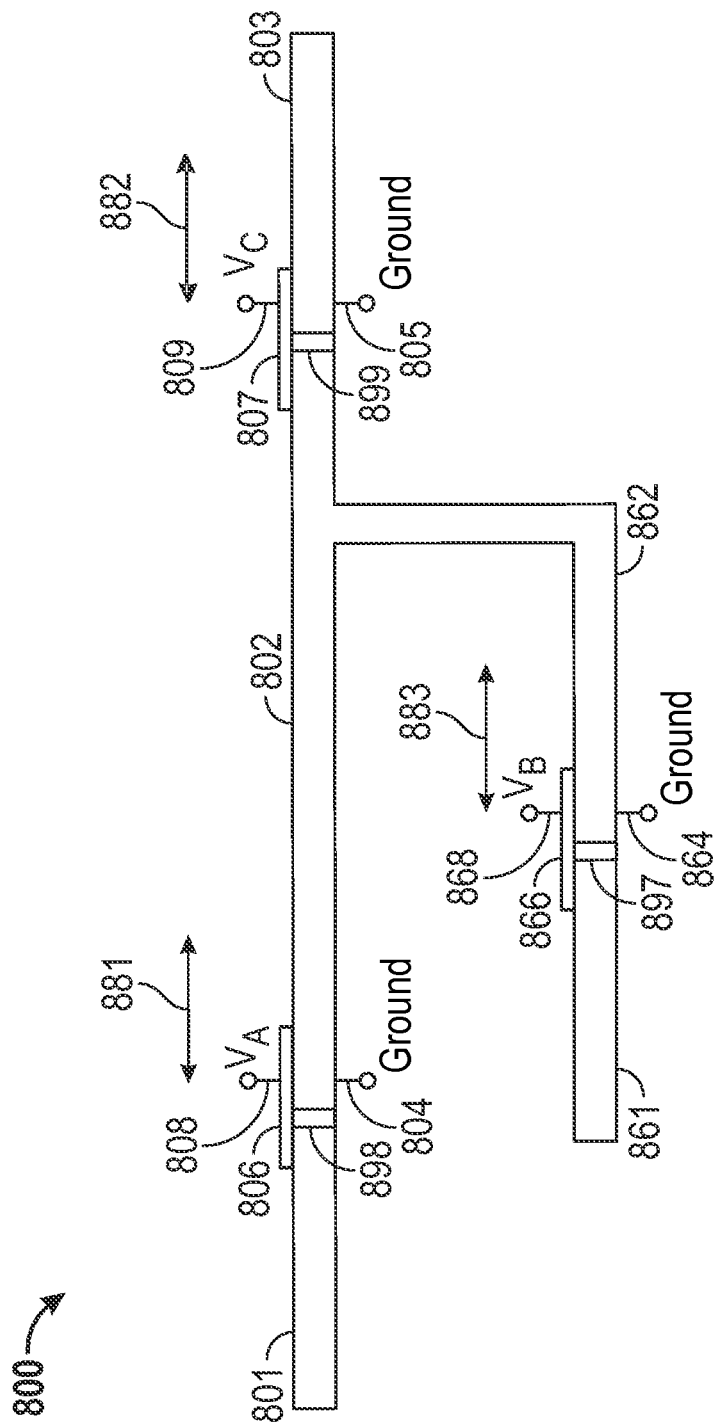

FIGS. 8(*a*) and 8(*b*) include an all-spin logic embodiment. (Similar spin logic is addressed in, for example, U.S. patent application Ser. No. 13/630,499, assigned to Intel Corp. of Santa Clara, Calif., USA.) FIG. 8(a) shows structural elements of an interconnect system. FIG. 8(b) utilizes the interconnect system to form a logic circuit. FIG. 8(a) is first discussed to understand how an embodiment of an interconnect works and then FIG. 8(b) is discussed to understand how an embodiment of a logic circuit works.

FIG. 8(a) shows an interconnect system that forms part of a logic circuit in an embodiment. In FIG. 8(a) separate nanomagnets 806, 807 are connected by/to non-magnetic wires 801, 802, 803. Information (e.g., a logic state) is transferred by flow of (diffusion) spin-polarized current.

More specifically, system or device 800 includes a substrate (not shown in this Figure), a metal layer, on the substrate, including metal portions 808, 809 that do not directly contact one another. A ferromagnetic layer, on the substrate, includes ferromagnetic portion 806 that directly contacts metal portion 808 and ferromagnetic portion 807 that directly contacts metal portion 809 but not ferromagnetic portion 806. Metal interconnect/wire 802 couples ferromagnetic portion 806 to ferromagnetic portion 807. There are no other ferromagnetic portions (beyond portions 806, 807) directly contacting either of metal portions 808, 809. In this embodiment metal spin interconnect 802 directly contacts ferromagnetic portions 806, 807 but other embodiments are not so limited and the contact may be indirect.

Ferromagnetic portion 806 overlaps metal interconnect 802 and ferromagnetic portion 807 overlaps metal interconnect 802. These two overlapping distances may vary in different embodiments. In an embodiment portion 806 may overlap interconnect 802 (e.g., between 10 and 300 nm) more than portion 807 overlaps interconnect 802 (e.g., between 10 and 300 nm but less than the overlap between 806 and 802). System 800 communicates spin polarized current (by way of supply voltage plane 810) from ferromagnetic portion 806 to ferromagnetic portion 807 based on the overlap distance between 802/807 being shorter than the overlap distance between 802/806. In other words, in this embodiment the current direction is dictated, at least in part, based on the dissimilar overlapping distances of portions 806, 807 and interconnect 802 (where current flows from the larger overlapped region to the small overlapped region). However, in other embodiments the overlapping may be reversed (807 overlaps 802 more than 806 overlaps 802) or the amount of overlap may be equal between portions 806, 807 and 802.

In one embodiment, metal interconnect 802 couples to ground layer 811 via a "first location" on metal interconnect 802 (i.e., the junction of via/interconnect 804 and interconnect 802). In the embodiment of FIG. 8(a) the first location is closer to ferromagnetic portion 806 than it is to ferromagnetic portion 807. (Please note the figures within this application are not drawn to scale.) Specifically, in one embodiment the distance between 804 and 806 (e.g., 0-50 nm) is shorter or smaller than the distance between 804 and 807 (e.g., 200-600 nm) but this is reversed in other embodiments where 804 is closer to 807 than 806. System 800 communicates spin polarized current (from supply voltage plane 810) via ferromagnetic portion 806 to ferromagnetic portion 807 based on the via 804/interconnect 802 junction being closer to ferromagnetic portion 806 than ferromagnetic portion 807. Sliding the via 804/interconnect 802 junction closer to portion 807 may reverse current direction (depending on other factors such as, for example, the amount of overlap between 802 and 807 and/or 802 and 806).

Furthermore, in addition to or instead of the above methods for determining spin current direction, the direction may further be controlled by varying injection efficiency (asymmetric spin current injection). As shown in FIG. 8, the dominant or master magnet (portion 806) injects net spin into system 800 towards the slave magnet (portion 807). As spin current weakens (nearing element 807 when traveling from 806 to 807) the current is then regenerated via elements 809, 807 to increase again to a higher level.

In an embodiment, metal interconnect 802 is non-magnetic. Metal interconnect 802 may include copper, aluminum, graphene, tin, and the like. In one embodiment ferromagnetic portions 806 and/or 807 include at least one of nickel, cobalt, iron, gadolinium, and Huesler alloy and combinations thereof. In an embodiment any element for portions 806, 807 may be doped with, for example, boron or similar materials (e.g., to assist in nanofabrication). Another embodiment includes materials, similar to nickel, cobalt, iron, Huesler alloy, and gadolinium, which are suitable for 806/807 because, for example, they have good magnetization at room temperature and/or strong magnetic anisotropy.

Metal portions 808 and/or 809 may comprise at least one noble metal and at least one 5d transition metal. Metal portions 808 and/or 809 may include materials comprising at least one of platinum, tantalum, copper, and gold (and combinations thereof), but other embodiments are not so limited. Other embodiments may include copper combined with an impurity. The impurity may include one or more 5d transition metals such as lutetium, hafnium, tantalum, tungsten, rhenium, osmium, iridium, platinum, gold, and mercury. The tantalum may include beta phase tantalum in one embodiment. Other embodiments may include one or more these impurities combined with gold, silver, and/or platinum. Still other embodiments may include gold, silver, and/or platinum combined with one or more 4d transition metal impurities such as yttrium, zirconium, niobium, molybdenum, technetium, ruthenium, rhodium, palladium, silver, and/or cadmium. Another embodiment may include mercury and tellurium. Still other embodiments may include artificially engineered metallic structures such as magnetic superlattices and other metal materials. Other embodiments include any of the noble metals combined with any 4d or 5d transition metal impurity. For example, such noble metals include gold, silver, platinum, ruthenium, rhodium, palladium, osmium, rhenium, and iridium. Other embodiments include materials similar to noble metals combined with any 4d or 5d transition metal impurity that are suitable for layer 808 and/or 809 because, for example, they exhibit spin dependent scattering and/or spin orbit interaction.

Various layers of system 800 are separated by oxide 860. Examples of materials described herein are non-exhaustive.

In one embodiment, metal portion 808 has a length (shown in FIG. 8(a) in the horizontal dimension) and a width (not shown in FIG. 8(a) as it is orthogonal to the viewer of that figure). Metal portion 809 also has a length collinear with the length of portion 808. The length of element 808 is longer than its width in one embodiment. In one embodiment the length for magnet layer 806 may be approximately half or one quarter of the length for metal layer 808. The length for magnet layer 806 (horizontal and running right-left in FIG. 8) may be approximately 50 nm and width for layer 806 may be approximately 100 nm. In another embodiment the length for metal portion 808 is about 104 nm, the length for magnet portion 806 is about 26 nm, and width for 808 and 806 is about 52 nm. However, in another embodiment magnet 806 length may be approximately 10, 20, 40, 60, 80, 100, 120, 140, 160, 180 nm or more, metal 808 length may be 50, 60, 70, 80, 120, 140, 160, 180 nm or more, and width for 808 and/or 806 may be approximately 30, 40, 75, 150 nm or more. Other embodiments are not so limited.

In one embodiment, ferromagnetic portion thickness (shown vertically in FIG. 8) is no greater than 5 nm and metal portion thickness is no less than 5 nm. In one embodiment 806 thickness may be approximately 3 nm and thickness for metal layer 808 may be approximately 10 nm. However, other embodiments include thickness for magnet layer 806 being approximately 1, 2, 4, 5, 6 nm or more and thickness for metal layer 808 being approximately 5, 6, 7, 8, 9, 11, 12, 13, 14, 15, 16, 17, 18, 19, 20 nm or more.

In one embodiment, interconnect thickness of interconnect 802 may be between 10 nm and 1 micron but other embodiments are not so limited. In one embodiment ferromagnetic portion 806 is separated from ferromagnetic portion 807 by between 25 nanometers and 15 microns but other embodiment are not so limited. In one embodiment, the distance is 100 nm. In another embodiment the distance is 10 microns. In one embodiment interconnects 801, 802, and/or 803 each have a length between 100 nm and 10 microns, and magnets 806, 807 each have ranges with dimensions as follows: thickness 0.1 nm to 10 nm, length 10 nm to 500 nm, and width 10 nm to 500 nm. However, other embodiments are not so limited.

In one embodiment, a "chain" of interconnects is formed with portions 808, 806 coupling interconnect 801 to interconnect 802 and portions 809, 807 coupling interconnect 802 to interconnect 803. Isolation portions 898, 899 are directly between interconnects 801, 802, 803 and directly and respectively contact ferromagnetic portions 806, 807. In one embodiment the isolation portions are between 1 and 100 nm in length (but other embodiments are not so limited).

While portions 808, 806 may be rectangular (length by width) in other embodiments one or both portions may be square, ovular or take on other shapes with rounded portions, and the like. Also, in FIG. 8(a) magnet layer 806 appears centered along metal 808, but in other embodiments magnet 806 may be lateral (left or right) of the midpoint for metal 808. Also, while in one embodiment the width is the same for each of portions 808, 806 in other embodiments the magnet portion may be wider or less wide than the metal portion.

In one embodiment supply voltage 810 is 1 mV to 100 mV (but other embodiments are not so limited).

In another embodiment interconnect 804 is moved closer to element 807 and further from element 806. Thus, interconnect/via 804 is moved closer to a magnetic element to help drive current from the nearest magnetic element to the more distant magnetic element. As shown in FIG. 8 element 804 is closer to element 806 than it is to element 807 and therefore current flows from 806 to 807. In other embodiments interconnect 804 may be located equidistant from portions 806 and 807.

While not shown explicitly in FIG. 8, an embodiment such as system 800 may include a third metal portion, included in the same metal layer as portions 808, 809 (and which does not directly contact either of portions 808, 809). Further, a third ferromagnetic portion, included in the same ferromagnetic layer as portions 806, 807, directly contacts the third metal portion (but not ferromagnetic portions 806, 807). For example, additional metal interconnect 803 couples ferromagnetic portion 807 to the third ferromagnetic portion (and does not directly contact metal interconnect 802 due to the gap between 802 and 803). This creates a longer "chain" of all spin (or substantially "all" spin) interconnects ("all spin" indicates no or almost no electrical to spin and spin to electrical conversions).

FIG. 8(b) utilizes an embodiment of the interconnect system to form a logic circuit. However, FIG. 8(b) is more schematic in nature than FIG. 8(a), includes input "B", and leaves various details out to better focus on operation of the C-element 800. The 8XX numbers are shared between FIGS. 8(a) and 8(b).

FIG. 8(b) includes the "A" input that couples to $V_A$ through interconnect 808. The polarity of $V_A$ determines the direction of spin current 881 that may be supplied from interconnect input 801. More specifically, $V_A$ imparts spin current that passes across magnetic element 806, through interconnect 802, to ground through via/interconnect 804. Spin current 881 is strongest near element 806 and dissipates as it traverses element 802 toward the "C" output of C element 800 (i.e., not all of the current is directed to ground). Interconnects 801, 802 are separated by non-magnetic material (e.g., oxide) 898.

FIG. 8(b) includes the "B" input that couples to $V_B$ through interconnect 868. The polarity of $V_B$ determines the direction of spin current 883 that may be supplied from interconnect input 861. More specifically, $V_B$ imparts spin current that passes across magnetic element 866, through interconnect 862, to ground through via/interconnect 864. Spin current 883 is strongest near element 866 and dissipates as it traverses element 862 toward the "C" output of C element 800 (i.e., not all of the current is directed to ground). Interconnects 861, 862 are separated by a non-magnetic, non conducting material (e.g., oxide) 897. Again, FIG. 8(b) is schematic in nature and does not necessarily imply that all embodiments include the "B" input in a layer located below the layer that includes the A and C nodes. For example, the B node may be on the same layers as those layers that include the A and C nodes.

FIG. 8(b) includes the "C" output that couples to $V_C$ through interconnect 809 and ground through interconnect 805. Magnetic element 807 is a free magnet that can orient itself into states "0" and "1" based on spin current from elements 806 and 866. Specifically, current 881 has its strongest spin orientation near element 806 and away from element 807. Similarly, current 883 has its strongest spin orientation near element 866 and away from element 807. If both current 881 and 883 have similar spins or states (induced by $V_A$ and $V_B$ both having the same polarity) then the spin currents, although diminished, are additive at or near element 807 and impart their spin, through STT, to element 807. The spin character of element 807 may then be determined by spin current accumulating in 809, which is output. Spin having one direction may have a "0" state and spin having the opposite direction may have a "1" state. If spin currents 881 and 883 have opposite spins they may be subtractive with diminished force and the inability to flip or change the pre-existing orientation of free ferromagnet 807. Thus, C element 800 follows the truth table of FIG. 2B.

Figure 9:
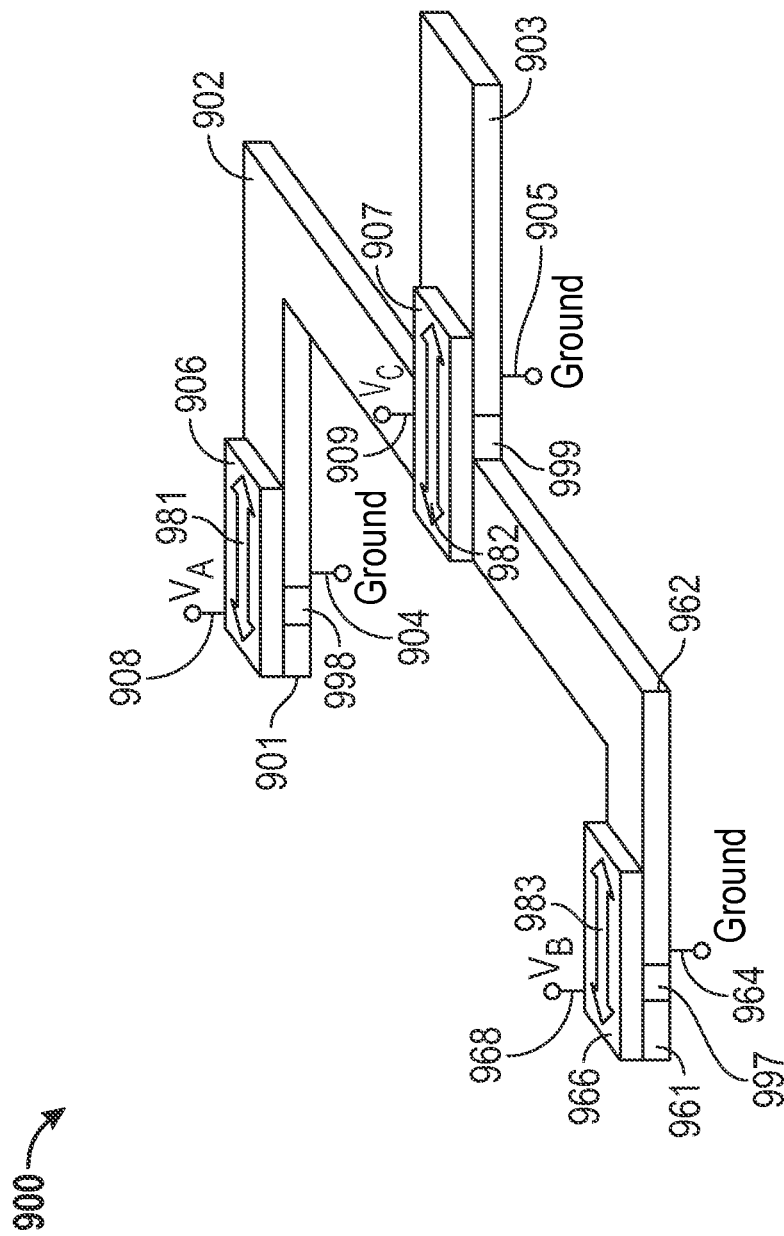
FIG. 9 depicts separate nanomagnets connected by non-magnetic wires in a spintronic C-element in an embodiment of the invention.

FIG. 9 is a perspective view of a C element 900. C element 900 includes the same components as C element 800 of FIG. 8(b) (using similar number systems but with 9xx series numbers instead of 8xx series numbers) but the C node is now centered between the A and B nodes. However, in other embodiments the C node may be in a different layer than the A and/or B nodes, may be closer to the B node than the A node, and the like. Regardless, explanation is not made for this Figure and every numbered element is not addressed considering the embodiment of FIG. 9 operates like the embodiment of FIG. 8.

While several embodiments include fixed and free layers comprising CoFe other embodiments may include Co, Fe, Ni, Ta, B and combinations/alloys thereof (e.g., CoFeB, NiFe), and the like. Further, embodiments may include tunnel barriers having something other than MgO, such as other oxides. Also, while layers such as pinning layer 404 are included in some embodiments, other embodiments do not necessarily include such layers.

While several embodiments depict multiple nanopillars all having the same dimensions, such as nanopillars 414, 415 respectively for inputs A and B in FIG. 4, in other embodiments this is not necessarily the case. For example, if inputs A and B are not equidistant from output C, the nanopillar/input that is furthest removed from output C may be larger than the nanopillar/input that is closest to output C in order to have proportionate or nearly equal weightings for inputs A and B (i.e., so that spin current from input A is equal in magnitude to spin current from input B at output C). The larger nanopillar may be necessary to carry increased current through a fixed layer that is larger than a fixed layer for the nanopillar that is closer to output C. The larger nanopillar and its related fixed layer and switching current may be necessary to impart a greater effect on the magnetic polarity of the free layer shared with the other input (or inputs) and output (or outputs). Furthermore, in other embodiments the distance of the source of inputs to A or B to the A or B nanopillars may necessitate larger nanopillars (e.g., the farther away the source of the input signal is to an input nanopillar, the larger the nanopillar will be). In still other embodiments the nanopillars may vary in size to vary the weighting each input has upon the polarity direction of the free layer. For example, a designer may wish input A to have a disproportionate weighting on polarity of the free layer as opposed to input B. Consequently the designer may make nanopillar A larger than nanopillar B. As shown in FIG. 4, the output nanopillar need not be spaced equidistantly to the input nanopillars of the logic gate (i.e., the output nanopillar may be closer to one input nanopillar than one or more other input nanopillars). In some embodiments no nanopillars are even used. Further, layers such as fixed layers 407, 409, 408 (as well as other layers including similar materials) may be formed at the same height above a substrate but that is not required for all embodiments. For example, layers 407, 409 may be formed from a common layer while 408 is formed from a layer above or below common layer for 407, 409.

While a 2 input/1 output C-element has been described in several embodiments other embodiments may utilize the same concept of a shared free layer, albeit with more inputs and/or outputs as is known for logic gates similar to C-elements and variations of C-elements (e.g., semi-static C-element, asymmetric C-elements having a "plus" input, a "minus" input, and a "common" input that collectively operate with an output).

Figure 10:
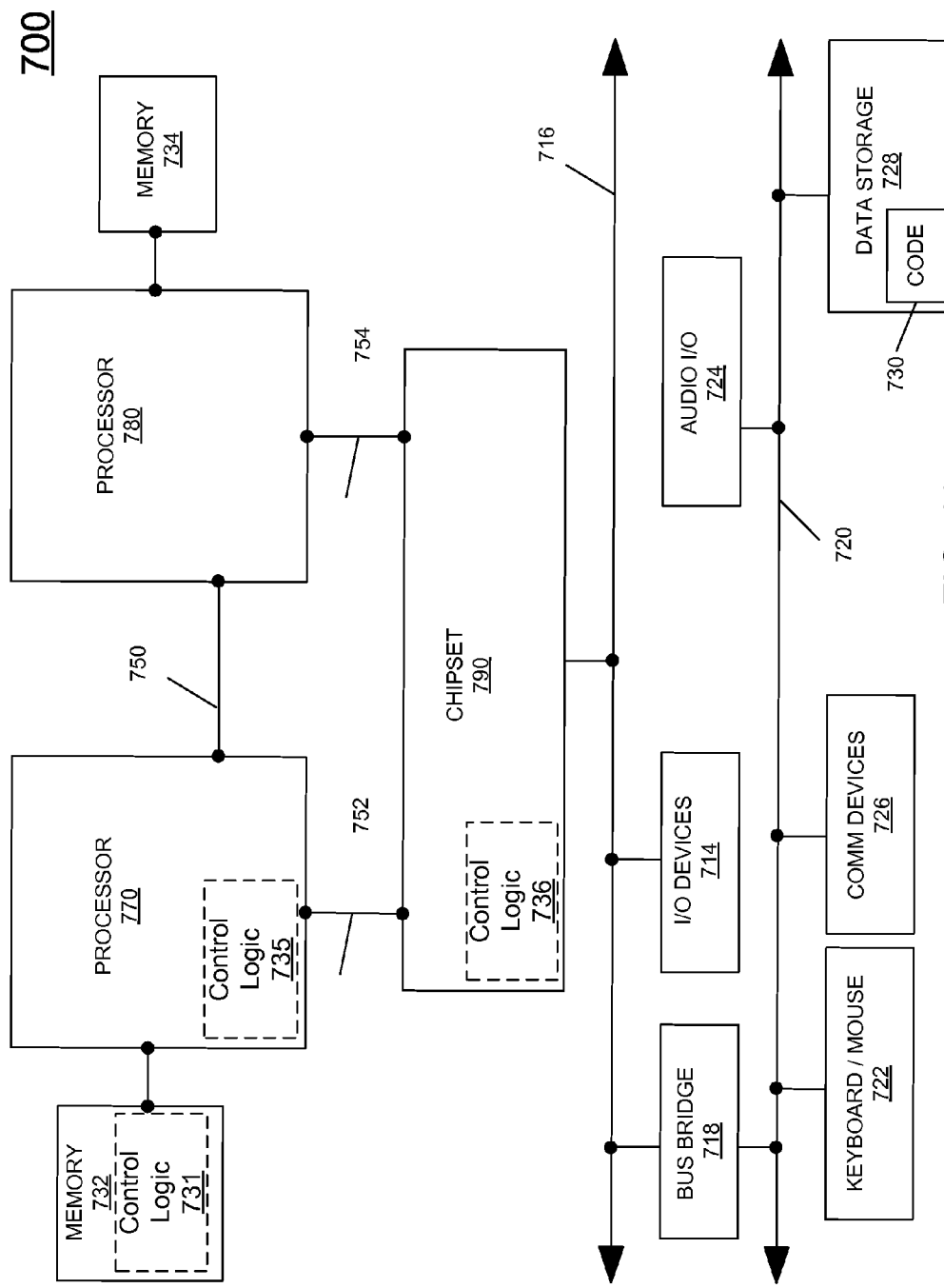
FIG. 10 depicts a system for use with embodiments of the invention.

Embodiments may be used in many different types of systems. For example, in one embodiment a communication device (e.g., cell phone, mobile computing node, Smartphone, netbook, notebook, personal computer, watch, and camera) can be arranged to include various embodiments described herein. Referring now to FIG. 10, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors including, for example, embedded non-volatile memory utilizing magnets and spin-based memory described herein. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM) or spin-based described herein) locally attached to the respective processors. However, the processors may be located on the same chip as memory described herein. First processor 770 and second processor 780 may be coupled to a chipset 790 via P-P interconnects, respectively. Chipset 790 may include P-P interfaces. Furthermore, chipset 790 may be coupled to a first bus 799 via an interface. Various input/output (I/O) devices 714 may be coupled to first bus 799, along with a bus bridge 718, which couples first bus 799 to a second bus 798. Chipset 790 may also include magnets and spin-based memory described herein. Various devices may be coupled to second bus 798 including, for example, a keyboard/mouse 722, communication devices 797, and data storage unit 728 such as a disk drive or other mass storage device (which may or may not use magnets and spin-based memory described herein), which may include code 730, in one embodiment. Code may be included in one or more memories including memory 728, 732, 734, memory coupled to system 700 via a network, and the like. Further, an audio I/O 724 may be coupled to second bus 798.

As used herein a processor or controller, chipset, or memory may include control logic intended to represent any of a wide variety of control logic known in the art and, as such, may well be implemented as a microprocessor, a micro-controller, a field-programmable gate array (FPGA), application specific integrated circuit (ASIC), programmable logic device (PLD), firmware, software, and the like. In some implementations, control logic 731, 735, 736 and the like are intended to represent content (e.g., software instructions, etc.), which when executed cause a system to perform a method (e.g., accessing memory).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

A first example includes a C-element comprising: a first nanopillar including a first fixed magnetic layer and coupled to a first contact; a second nanopillar including a second fixed magnetic layer and coupled to a second contact; and a third nanopillar including a third fixed magnetic layer and coupled to a third contact; wherein (a) the first, second, and third nanopillars are all formed over a common free magnetic layer, and (b) the third fixed magnetic layer, the tunnel barrier, and the free magnetic layer form a magnetic tunnel junction (MTJ).

A second example includes the subject matter of example 1 wherein the first and second nanopillars are formed on a common axis and the third nanopillar is formed on an additional axis that is orthogonal to the common axis.

A third example may include the subject matter of examples 1-2 wherein neither of the first and second nanopillars is formed on the additional axis.

A fourth example may include the subject matter of examples 1-3, wherein the free magnetic layer is monolithic.

A fifth example may include the subject matter of examples 1-4, wherein the free magnetic layer has a low logic state when both of the first and second nanopillars are supplied with low logic state current.

A sixth example may include the subject matter of examples 1-5, wherein the free magnetic layer has a low logic state when both of the first and second nanopillars are simultaneously supplied with low logic state current.

A seventh example may include the subject matter of examples 1-6, wherein the free magnetic layer retains a previously programmed logic state when the first and second nanopillars are supplied with opposite logic state currents.

An eighth example may include the subject matter of examples 1-7 with the C-element formed on a substrate upon which a magnetic memory including an additional MTJ is formed, wherein a fixed magnetic layer of the additional MTJ and the third fixed magnetic layer are both formed at a common layer level above the substrate.

A ninth example may include the subject matter of examples 1-8 comprising an additional nanopillar including an additional contact and an additional fixed magnetic layer; wherein the additional nanopillar is formed over the common free magnetic layer.

A tenth example may include the subject matter of examples 1-9, wherein none of the first, second, and third nanopillars includes any other additional fixed magnetic layer beyond the first, second, and third fixed magnetic layers.

An eleventh example may include the subject matter of examples 1-10, wherein a logic state of the C-element is programmable based on spin transfer torque (STT) effect and the logic state is read based on sensing tunneling magnetoresistance (TMR) of the MTJ.

A twelfth example may include the subject matter of examples 1-11, wherein the third nanopillar includes a tunnel barrier layer between the third fixed magnetic layer and the free magnetic layer.

A thirteenth example may include a logic gate comprising: first, second, and third nanopillars each including a fixed magnetic layer; wherein (a) each of the first, second, and third nanopillars is formed over and shares a common free magnetic layer, and (b) a logic state for the third nanopillar is determined based on logic states for the first and second nanopillars.

A fourteenth example may include the subject matter of example 13 wherein the first, second, and third nanopillars are non-collinear with each other.

A fifteenth example may include the subject matter of examples 13-14, wherein the logic gate includes asynchronous logic.

A sixteenth example may include the subject matter of examples 13-15, comprising a magnetic tunnel junction (MTJ), wherein a tunnel junction of the MTJ is included in the third nanopillar and there is no tunnel junction included in either of the first and second nanopillars.

A seventeenth example may include the subject matter of examples 13-16, wherein the free magnetic layer has a low logic state when both of the first and second nanopillars are supplied with a low logic state.

An eighteenth example includes a method comprising: providing a C-element including first, second, and third nanopillars that each comprise a fixed magnetic layer and couple to a contact; wherein (a) each of the first, second, and third nanopillars is formed over and shares a common free magnetic layer, and (b) a logic state for the third nanopillar is determined based on logic states for the first and second nanopillars; providing first and second low logic signals respectively to the first and second nanopillars; and converting the third nanopillar from a high logic state to a low logic state based on the first and second low logic signals. Thus, a logic state for the free layer dictates a logic state for the third nanopillar (which may be used to sense the logic state of the free layer).

A nineteenth example may include the subject matter of example 18 comprising simultaneously providing the first and second low logic signals respectively to the first and second nanopillars.

A twentieth example may include the subject matter of examples 18-19 comprising converting the third nanopillar from the high logic state to the low logic state within 5 ns of providing the first and second low logic signals respectively to the first and second nanopillars.

A twenty-first example includes an apparatus comprising: first, second, and third metal members that do not directly contact one another; a first magnetic member directly contacting the first metal member, a second magnetic member directly contacting the second metal member, and a free magnetic member directly contacting the third metal member; and a first metal interconnect coupling the first magnetic member to the free magnetic member and a second metal interconnect coupling the second magnetic member to the free magnetic member; wherein there is no additional magnetic member directly contacting any of the first, second, and third metal members; wherein a logic state for the free magnetic member is determined based on logic states for the first and second magnetic members.

A twenty-second example may include the subject matter of example 21 wherein the logic state for the first magnetic member is determined based on spin current orientation from the first magnetic member and the logic state for the second magnetic member is determined based on spin current orientation from the second magnetic member.

A twenty-third example may include the subject matter of examples 21-22 wherein the first metal interconnect directly contacts the first magnetic member and the free magnetic member.

A twenty-fourth example may include the subject matter of examples 21-23 wherein: the free magnetic member has a low logic state when both of the first and second magnetic members have low logic states; the free magnetic member has a high logic state when both of the first and second magnetic members have low logic states; and the free magnetic member retains a previously programmed logic state when the first and second magnetic members have opposite logic state currents.

A twenty-fifth example may include the subject matter of examples 21-24 included within a C element that includes no fixed magnetic layer. Thus, in an embodiment each of elements 906, 966, 907 is a free magnet layer that may flip magnetic orientation.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A C-element comprising:
    a first nanopillar including a first fixed magnetic layer and coupled to a first contact;
    a second nanopillar including a second fixed magnetic layer and coupled to a second contact; and
    a third nanopillar including a third fixed magnetic layer and coupled to a third contact;
    wherein (a) the first, second, and third nanopillars are included in the C-element and are all formed over a common free magnetic layer, and (b) the third fixed magnetic layer and the free magnetic layer form a magnetic tunnel junction (MTJ).

2. The C-element of claim 1, wherein the first and second nanopillars are formed on a common axis and the third nanopillar is formed on an additional axis that is orthogonal to the common axis.

3. The C-element of claim 2, wherein neither of the first and second nanopillars is formed on the additional axis.

4. The C-element of claim 1, wherein the free magnetic layer is monolithic.

5. The C-element of claim 1, wherein the free magnetic layer has a low logic state when both of the first and second nanopillars are supplied with low logic state current.

6. The C-element of claim 1, wherein the free magnetic layer has a low logic state when both of the first and second nanopillars are simultaneously supplied with low logic state current.

7. The C-element of claim 1, wherein the free magnetic layer retains a previously programmed logic state when the first and second nanopillars are supplied with opposite logic state currents.

8. The C-element of claim 1 formed on a substrate upon which a magnetic memory including an additional MTJ is formed, wherein a fixed magnetic layer of the additional MTJ and the third fixed magnetic layer are both formed at a common layer level above the substrate.

9. The C-element of claim 1 comprising an additional nanopillar including an additional contact and an additional fixed magnetic layer; wherein the additional nanopillar is formed over the common free magnetic layer.

10. The C-element of claim 1 wherein none of the first, second, and third nanopillars includes any other additional fixed magnetic layer beyond the first, second, and third fixed magnetic layers.

11. The C-element of claim 10 wherein a logic state of the C-element is programmable based on spin transfer torque (STT) effect and the logic state is read based on sensing tunneling magnetoresistance (TMR) of the MTJ.

12. The C-element of claim 1 wherein:
    the third nanopillar includes a tunnel barrier layer between the third fixed magnetic layer and the free magnetic layer; and
    the tunnel barrier layer between the third fixed magnetic layer and the free magnetic layer is not located directly below either of the first and second fixed magnetic layers.

13. A logic gate comprising:
    first, second, and third nanopillars respectively including first, second, and third fixed magnetic layers;
    wherein (a) each of the first, second, and third nanopillars is formed over and shares a common free magnetic layer, (b) a logic state for the third nanopillar is determined based on logic states for the first and second nanopillars, and (c) none of the first, second, and third nanopillars includes any other additional fixed magnetic layer beyond the first, second, and third fixed magnetic layers.

14. The logic gate of claim 13, wherein the first, second, and third nanopillars are non-collinear with each other.

15. The logic gate of claim 13, wherein the logic gate includes asynchronous logic.

16. A logic gate comprising:
    first, second, and third nanopillars each including a fixed magnetic layer; and
    a magnetic tunnel junction (MTJ), wherein a tunnel junction of the MTJ is included in the third nanopillar and there is no tunnel junction included in either of the first and second nanopillars.
    wherein (a) each of the first, second, and third nanopillars is formed over and shares a common free magnetic layer, and (b) a logic state for the third nanopillar is determined based on logic states for the first and second nanopillars.

17. The logic gate of claim 13, wherein the free magnetic layer has a low logic state when both of the first and second nanopillars are supplied with a low logic state.

18. A method comprising:
    providing a C-element including first, second, and third nanopillars that each comprise a fixed magnetic layer and couple to a contact; wherein (a) each of the first, second, and third nanopillars is formed over and shares a common free magnetic layer, and (b) a logic state for the third nanopillar is determined based on logic states for the first and second nanopillars;
    providing first and second low logic signals respectively to the first and second nanopillars; and
    converting the third nanopillar from a high logic state to a low logic state based on the first and second low logic signals.

19. The method of claim 18 comprising simultaneously providing the first and second low logic signals respectively to the first and second nanopillars.

20. The method of claim 18 comprising converting the third nanopillar from the high logic state to the low logic state within 5 ns of providing the first and second low logic signals respectively to the first and second nanopillars.

21. An apparatus comprising:
    first, second, and third metal members that do not directly contact one another;
    a first magnetic member directly contacting the first metal member, a second magnetic member directly contacting the second metal member, and a free magnetic member directly contacting the third metal member; and
    a first metal interconnect coupling the first magnetic member to the free magnetic member and a second metal interconnect coupling the second magnetic member to the free magnetic member;

wherein there is no additional magnetic member directly contacting any of the first, second, and third metal members;

wherein a logic state for the free magnetic member is determined based on logic states for the first and second magnetic members.

22. The apparatus of claim 21, wherein the logic state for the first magnetic member is determined based on spin current orientation from the first magnetic member and the logic state for the second magnetic member is determined based on spin current orientation from the second magnetic member.

23. The apparatus of claim 21, wherein the first metal interconnect directly contacts the first magnetic member and the free magnetic member.

24. The apparatus of claim 21, wherein:

the free magnetic member has a low logic state when both of the first and second magnetic members have low logic states;

the free magnetic member has a high logic state when both of the first and second magnetic members have low logic states; and the free magnetic member retains a previously programmed logic state when the first and second magnetic members have opposite logic state currents.

25. The apparatus of claim 23 included within a C element that includes no fixed magnetic layer.

* * * * *